United States Patent
Huang et al.

(10) Patent No.: US 12,096,657 B2
(45) Date of Patent: Sep. 17, 2024

(54) DISPLAY CIRCUITRY WITH SEMICONDUCTING OXIDE TRANSISTORS

(71) Applicant: Apple Inc., Cupertino, CA (US)

(72) Inventors: Jung Yen Huang, Taoyuan (TW); Shinya Ono, Santa Clara, CA (US); Chin-Wei Lin, San Jose, CA (US); Akira Matsudaira, Santa Clara, CA (US); Cheng Min Hu, Hsinchu (TW); Chih Pang Chang, Hsinchu (TW); Ching-Sang Chuang, Sunnyvale, CA (US); Gihoon Choo, San Jose, CA (US); Jiun-Jye Chang, Cupertino, CA (US); Po-Chun Yeh, Sunnyvale, CA (US); Shih Chang Chang, Cupertino, CA (US); Yu-Wen Liu, Hsinchu County (TW); Zino Lee, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 450 days.

(21) Appl. No.: 17/504,230

(22) Filed: Oct. 18, 2021

(65) Prior Publication Data
US 2022/0181418 A1 Jun. 9, 2022

Related U.S. Application Data

(60) Provisional application No. 63/122,319, filed on Dec. 7, 2020.

(51) Int. Cl.
*H01L 27/32* (2006.01)
*H01L 29/66* (2006.01)
(Continued)

(52) U.S. Cl.
CPC .... *H10K 59/1213* (2023.02); *H01L 29/66742* (2013.01); *H01L 29/7869* (2013.01); *H10K 59/1216* (2023.02); *H10K 59/1201* (2023.02)

(58) Field of Classification Search
CPC . H01L 27/1222; H01L 27/12; H01L 27/1225; H01L 29/66742; H01L 29/66;
(Continued)

(56) References Cited

U.S. PATENT DOCUMENTS 10,269,832 B2 * 4/2019 Hayashi ............... H01L 27/088
10,475,862 B2 11/2019 Jeong et al.
(Continued)

FOREIGN PATENT DOCUMENTS

CN 107204291 A 9/2017
CN 110890381 A 3/2020
(Continued)

*Primary Examiner* — Nikolay K Yushin
(74) *Attorney, Agent, or Firm* — Treyz Law Group, P.C.; Jason Tsai; Jinie M. Guihan

(57) ABSTRACT

A display may include an array of pixels. Each pixel in the array includes an organic light-emitting diode coupled to associated semiconducting oxide transistors. The semiconducting oxide transistors may exhibit different device characteristics. Some of the semiconducting oxide transistors may be formed using a first oxide layer formed from a first semiconducting oxide material using first processing steps, whereas other semiconducting oxide transistors are formed using a second oxide layer formed from a second semiconducting oxide material using second processing steps different than the first processing steps. The display may include three or more different semiconducting oxide layers formed during different processing steps.

28 Claims, 15 Drawing Sheets

(51) Int. Cl.
*H01L 29/786* (2006.01)
*H10K 59/121* (2023.01)
*H10K 59/12* (2023.01)

(58) Field of Classification Search
CPC .............. H01L 29/7869; H01L 29/786; H10K 59/1213; H10K 59/121; H10K 59/1216; H10K 59/1201; H10K 59/12
See application file for complete search history.

(56) References Cited

U.S. PATENT DOCUMENTS

| | | |
|---|---|---|
| 10,476,020 B2 | 11/2019 | Kurata et al. |
| 10,559,639 B2 | 2/2020 | Shi |
| 11,398,508 B2 * | 7/2022 | Kuwahara ............ H01L 27/1251 |
| 2017/0309649 A1 * | 10/2017 | Hayashi ............ H01L 29/78696 |
| 2018/0040639 A1 | 2/2018 | Lee et al. |
| 2020/0067012 A1 | 2/2020 | Su et al. |
| 2020/0075641 A1 | 3/2020 | Park et al. |
| 2021/0135144 A1 | 5/2021 | Zhang et al. |
| 2021/0202540 A1 * | 7/2021 | Kuwahara ............ H01L 27/1251 |

FOREIGN PATENT DOCUMENTS

| | | |
|---|---|---|
| CN | 111143212 A | 5/2020 |
| KR | 20160001851 A | 1/2016 |
| WO | 2018038107 A1 | 3/2018 |
| WO | 2020207119 A1 | 10/2020 |

* cited by examiner

DISPLAY CIRCUITRY WITH SEMICONDUCTING OXIDE TRANSISTORS

This application claims the benefit of provisional patent application No. 63/122,319, filed Dec. 7, 2020, which is hereby incorporated by reference herein in its entirety.

BACKGROUND

This relates generally to electronic devices with displays and, more particularly, to display driver circuitry for displays such as organic light-emitting diode (OLED) displays.

Electronic devices often include displays. For example, cellular telephones and portable computers typically include displays for presenting image content to users. OLED displays have an array of display pixels based on light-emitting diodes. In this type of display, each display pixel includes a light-emitting diode and associated thin-film transistors for controlling application of data signals to the light-emitting diode to produce light. It can be challenging to design display pixels.

SUMMARY

An electronic device may include a display having an array of display pixels. The display pixels may be organic light-emitting diode display pixels. Each display pixel may include at least an organic light-emitting diode (OLED) that emits light and associated semiconducting oxide transistors optimized to provide different device characteristics.

In accordance with some embodiments, a display is provided that includes a substrate layer, a first semiconducting oxide layer formed over the substrate layer, a second semiconducting oxide layer formed over the substrate layer, and a gate conductor layer. At least one of the pixels in the array can include a first semiconducting oxide transistor having an active region formed from a portion of the first semiconducting oxide layer and having a gate terminal formed from a first portion of the gate conductor layer, and a second semiconducting oxide transistor having an active region formed from a portion of the second semiconducting oxide layer and having a gate terminal formed from a second portion of the gate conductor. The first semiconducting oxide layer can be a first semiconductor material, whereas the second semiconducting oxide layer can be a second semiconductor material different than the first semiconductor material.

The display can further include a first gate insulating layer and a second gate insulating layer formed over the first gate insulating layer, where a first portion of the first gate insulating layer is interposed between the active region and the gate terminal of the first semiconducting oxide transistor, a first portion of the second gate insulating layer is interposed between the active region and the gate terminal of the first semiconducting oxide transistor, a second portion of the first gate insulating layer is formed under the active region of the second semiconducting oxide transistor, and a second portion of the second gate insulating layer is interposed between the active region and the gate terminal of the second semiconducting oxide transistor. The display can further includes a conductive layer between the substrate layer and the first semiconducting oxide layer, where a first portion of the conductive layer is formed below the active region of the first semiconducting oxide transistor, and a second portion of the conductive layer is formed below the active region of the second semiconducting oxide transistor.

In accordance with some embodiments, a method of forming a display is provided that includes obtaining a substrate layer, forming a first semiconducting oxide layer over the substrate layer, forming a second semiconducting oxide layer over the substrate layer after forming the first semiconducting oxide layer, and forming a gate conductor layer over the second semiconducting oxide layer. The display can include a first semiconducting oxide transistor having an active region formed from a portion of the first semiconducting oxide layer and having a gate terminal formed from a first portion of the gate conductor layer, and a second semiconducting oxide transistor having an active region formed from a portion of the second semiconducting oxide layer and having a gate terminal formed from a second portion of the gate conductor. The first semiconducting oxide layer can be formed from a first semiconductor material optionally under a first deposition condition, whereas the second semiconducting oxide layer can be formed from a second semiconductor material (which can be different than the first semiconductor material) optionally under a second deposition condition different than the first deposition condition.

In accordance with some embodiments, an apparatus is provided that includes a first semiconducting oxide transistor formed on a substrate, the first semiconducting oxide transistor having a first active region formed from a first oxide semiconductor to provide a first device characteristic, and a second semiconducting oxide transistor formed on the substrate, the second semiconducting oxide transistor having a second active region formed from a second oxide semiconductor different than the first oxide semiconductor to provide a second device characteristic different than the first device characteristic. The apparatus can further include a third semiconducting oxide transistor formed on the substrate, the third semiconducting oxide transistor having a third active region formed from a third oxide semiconductor different than the first and second oxide semiconductors to provide a third device characteristic different than the first and second device characteristics. The second active region can also include the first oxide semiconductor. The first semiconducting oxide transistor can include a first gate conductor and a first number of gate insulating layers between the first gate conductor and the first active region. The second semiconducting oxide transistor can include a second gate conductor and a second number of gate insulating layers, different than the first number of gate insulating layers, between the second gate conductor and the second active region.

DETAILED DESCRIPTION

Figure 1:
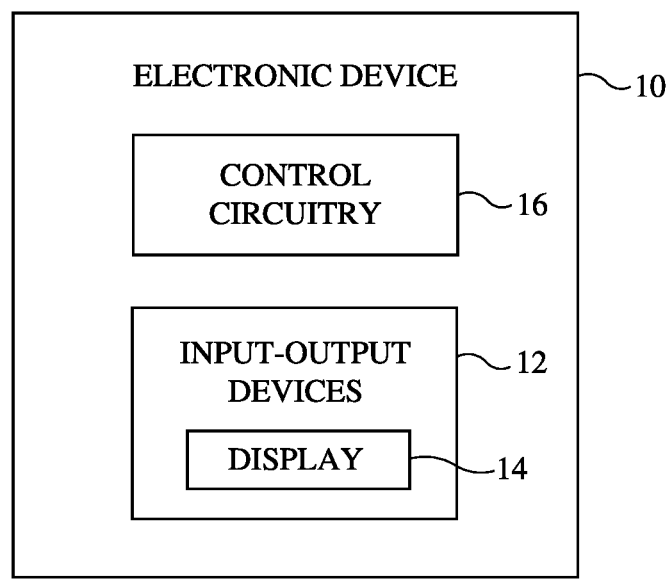
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
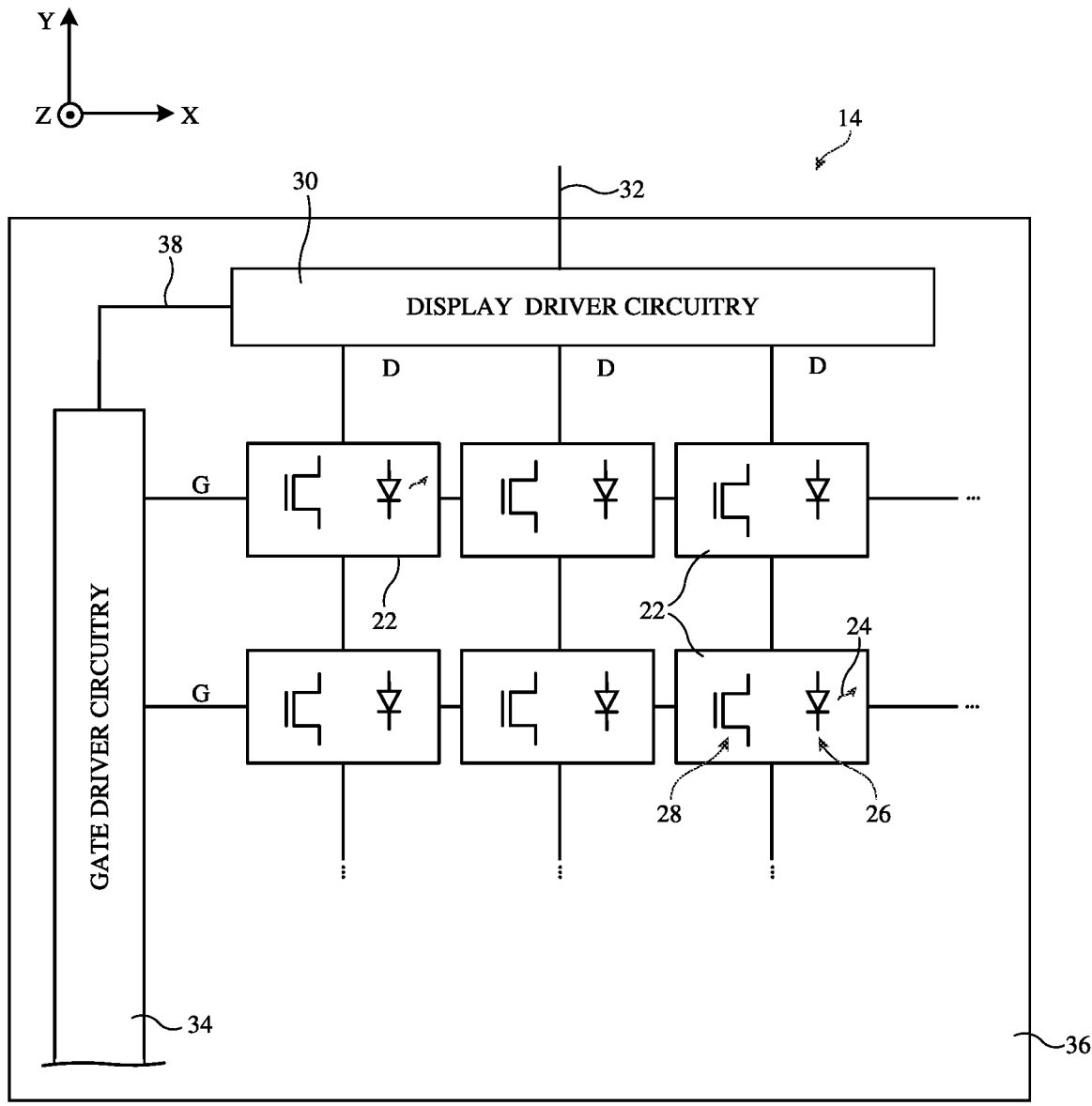
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.).

Figure 3:
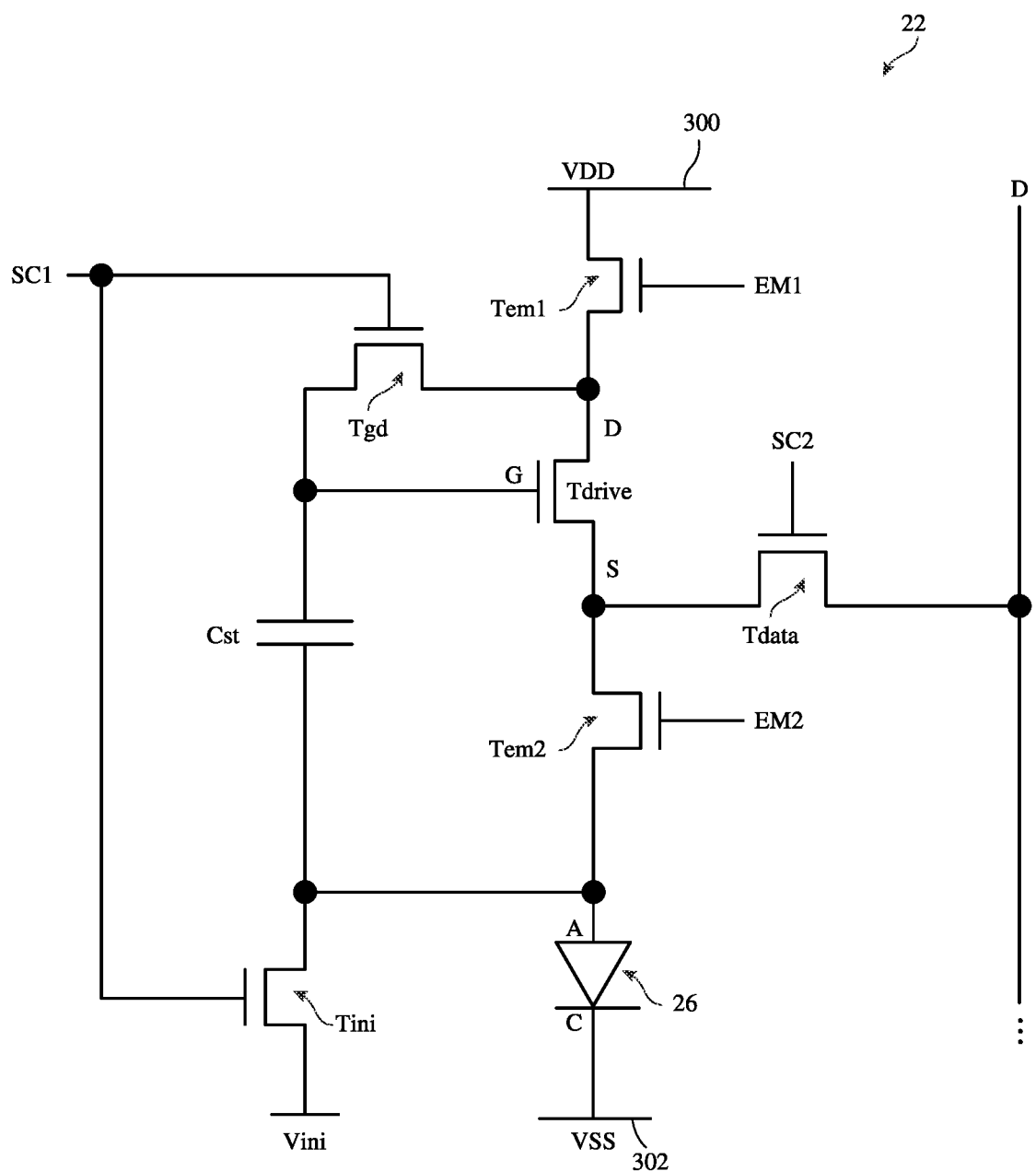
FIG. 3 is a circuit diagram of an illustrative organic light-emitting diode display pixel in accordance with some embodiments.

FIG. 3 is a circuit diagram of an illustrative organic light-emitting diode display pixel 22 in display 14. As shown in FIG. 3, display pixel 22 may include a light-emitting element such as an organic light-emitting diode 26, a capacitor such as storage capacitor Cst, and thin-film transistors such a drive transistor Tdrive, a gate-to-drain transistor Tgd, a data loading transistor Tdata, an initialization transistor Tini, and emission transistors Tem1 and Tem2. In accordance with some embodiments, all of the transistors within pixel 22 such as Tdrive, Tgd, Tdata, Tini, Tem1, and Tem2 are semiconducting oxide transistors. Semiconducting oxide transistors are defined as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of drive transistor Tdrive).

If desired, at least some of the transistors within pixel 22 may be implemented as silicon transistors such that pixel 22 has a hybrid configuration that includes a combination of semiconducting oxide transistors and silicon transistors (e.g., n-type thin-film transistors or p-type LTPS transistors). In yet other suitable embodiments, pixel 22 may include one or more anode reset transistors configured to reset the anode (A) terminal of diode 26. As another example, display pixel 22 may further include one or more initialization transistors for apply an initialization or reference voltage to an internal node within pixel 22. As another example, display pixel 22 may further include additional switching transistors (e.g., one or more additional semiconducting oxide transistors or silicon transistors) for applying one or more bias voltages for improving the performance or operation of pixel 22.

Drive transistor Tdrive has a drain (D) terminal, a gate (G) terminal, and a source (S) terminal. The terms "source" and "drain" terminals that are used to describe current-conducting terminals of a transistor are sometimes interchangeable and may sometimes be referred to herein as "source-drain" terminals. Drive transistor Tdrive, emission control transistors Tem1 and Tem2, and light-emitting diode 26 may be coupled in series between positive power supply line 300 and ground power supply line 302. Emission transistor Tem1 has a gate terminal configured to receive a first emission control signal EM1, whereas emission transistor Tem2 has a gate terminal configured to receive a second emission control signal EM2. This example in which transistors Tem1 and Tem2 receive two different emission signals is merely illustrative. As another example, transistors Tem1 and Tem2 can receive the same emission control signal.

A positive power supply voltage VDD may be supplied to positive power supply terminal 300, whereas a ground power supply voltage VSS may be supplied to ground power supply terminal 302. Positive power supply voltage VDD may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. Ground power supply voltage VSS may be 0 V, −1 V, −2 V, −3 V, −4 V, −5 V, −6V, −7 V, less than 2 V, less than 1 V, less than 0 V, or any suitable ground or negative power supply voltage level. During emission operations, signal EM is asserted (e.g., driven high) to turn on transistors Tem1 and Tem2, which allows current to flow from drive transistor Tdrive to diode 26. The degree to which drive transistor Tdrive is turned on controls the amount of current flowing from terminal 300 to terminal 302 through diode 26, and therefore the amount of emitted light from display pixel 22.

In the example of FIG. 3, storage capacitor Cst may be coupled between the gate terminal of drive transistor Tdrive and the anode (A) terminal of diode 26. Transistor Tgd may have a first source-drain terminal connected to the gate terminal of transistor Tdrive, a second source-drain terminal connected to the drain terminal of drive transistor Tdrive, and a gate terminal configured to receive a first scan control signal SC1. Transistor Tini may have a first source-drain terminal connected to the anode terminal of diode 26, a second source-drain terminal configured to receive an initialization (reference) voltage Vini via an initialization voltage line, and a gate terminal configured to receive scan signal SC1.

Data loading transistor Tdata may have a first source-drain terminal connected to the source terminal of transistor Tdrive, a second source-drain terminal connected to the data line, and a gate terminal configured to receive a second scan control signal SC2. Scan control signals SC1 and SC2 may be provided over row control lines (see lines G in FIG. 2). Although display pixel 22 is shown to include only one capacitor Cst, display pixel 22 may include any suitable number of capacitors. As another example, pixel 22 can include a total of only two capacitors. As another example, pixel 22 can include a total of only three capacitors. As yet another example, pixel 22 can include more than three capacitor components.

In practice, pixel 22 may be subject to process, voltage, and temperature (PVT) variations. Due to such variations, transistor threshold voltages between different display pixels 22 can vary. Variations in the threshold voltage of transistor Tdrive can cause different display pixels 22 to produce amounts of light that do not match the desired image. In an effort to mitigate threshold voltage variations, display pixel 22 of the type shown in FIG. 3 may be operable to support in-pixel threshold voltage (Vth) compensation. In-pixel threshold voltage compensation operations, sometimes referred to as an in-pixel Vth canceling scheme, may generally include at least an initialization phase, a threshold voltage sampling phase, a data programming phase, and an emission phase. During the threshold voltage sampling phase, the threshold voltage of transistor Tdrive may be sampled using storage capacitor Cst. Subsequently, during the emission phase, the emission current flowing through transistors Tem1 and Tem2 into the light-emitting diode 26 has a term that cancels out with the sampled Vth. As a result, the emission current will be independent of the drive transistor Vth and therefore be immune to any Vth variations at the drive transistor.

Figure 4:
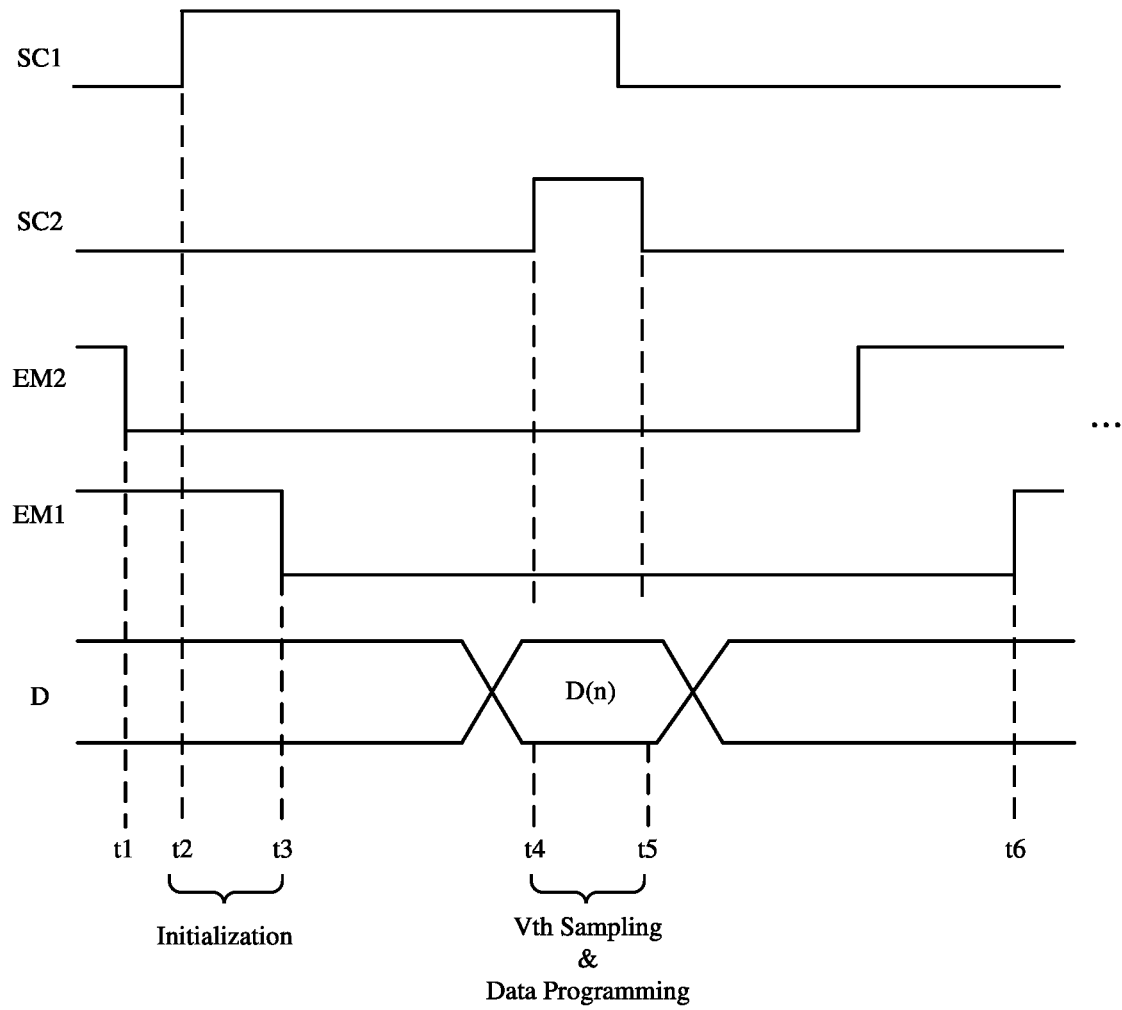
FIG. 4 is a timing diagram showing illustrative waveforms involved in operating the display pixel of FIG. 3 in accordance with some embodiments.

FIG. 4 is a timing diagram showing illustrative waveforms involved in operating display pixel 22 of the type shown in FIG. 3. As shown in FIG. 4, emission signal EM2 is deasserted (driven low) at time t1. Prior to time t1, emission signals EM1 and EM2 are both asserted (driven high), so pixel 22 is operating in the emission phase during which diode 26 is emitting light. When emission signal EM2 is deasserted, pixel 22 stops emitting light.

At time t2, scan control signal SC1 is asserted (driven high) to activate transistors Tgd and Tini. During this time, transistor Tini will bias the anode terminal of diode 26 to initialization voltage Vini. Since emission transistor Tem1 is still on, the drain and gate terminals of drive transistor Tdrive will be pulled up to positive supply voltage VDD, which in turn pulls up the source terminal of transistor Tdrive up towards VDD (e.g., to one threshold voltage level under VDD). At time t3, emission control signal EM1 is deasserted (driven low) to turn off transistor Tem1. The period from time t2 to t3 is sometimes referred to as the initialization phase or the initialization period.

From time t4 to t5, scan control signal SC2 is pulsed high to turn on (activate) transistor Tdata. Activating transistor Tdata will load data signal D(n) into pixel 22 (e.g., by driving the data signal onto the source terminal of transistor Tdrive). Since signal SC1 is still high during this time, the voltage at the gate and drain terminals of transistor Tdrive will shift up or down depending on the value of D(n), thus still retaining the Vth difference across the gate and source terminals since the voltage has nowhere to discharge. The time period from time t4 to t5 is therefore sometimes referred to as the threshold voltage sampling and data programming phase or Vth sampling and data programming period. At time t6, emission control signals EM1 and EM2 are both asserted (driven high) to resume the emission period.

Different transistors within display 14 may require different device characteristics for optimal display performance and operation. As an example, transistors Tgd, Tdata, and Tini are transistors that are predominantly in the off state may require better negative-bias-temperature-stress (NBTS) stability. As another example, transistors Tdrive, Tem1, and Tem2 are transistors that are predominantly in the on state may require better positive-bias-temperature-stress (PBTS) stability. As another example, transistors within the gate driver circuits (e.g., transistors within gate driver circuitry 34 in FIG. 2) may benefit from better PBTS and higher mobility.

To satisfy these different requirements, display 14 may be formed using semiconducting oxide transistors with different device characteristics. For instance, a first subset of the semiconducting oxide transistors in display 14 may be formed to achieve good NBTS; a second subset of the semiconducting oxide transistors in display 14 may be formed to achieve good PBTS; and a third subset of the semiconducting oxide transistors in display 14 may be formed to achieve high mobility. The third subset may or may not intersect with the first and second subsets (e.g., a semiconducting oxide transistor can simultaneously exhibit high mobility and good NBTS or good PBTS). To provide semiconducting oxide transistors with different device characteristics, multiple layers of semiconducting oxide material may be formed at different processing steps.

Figure 5:
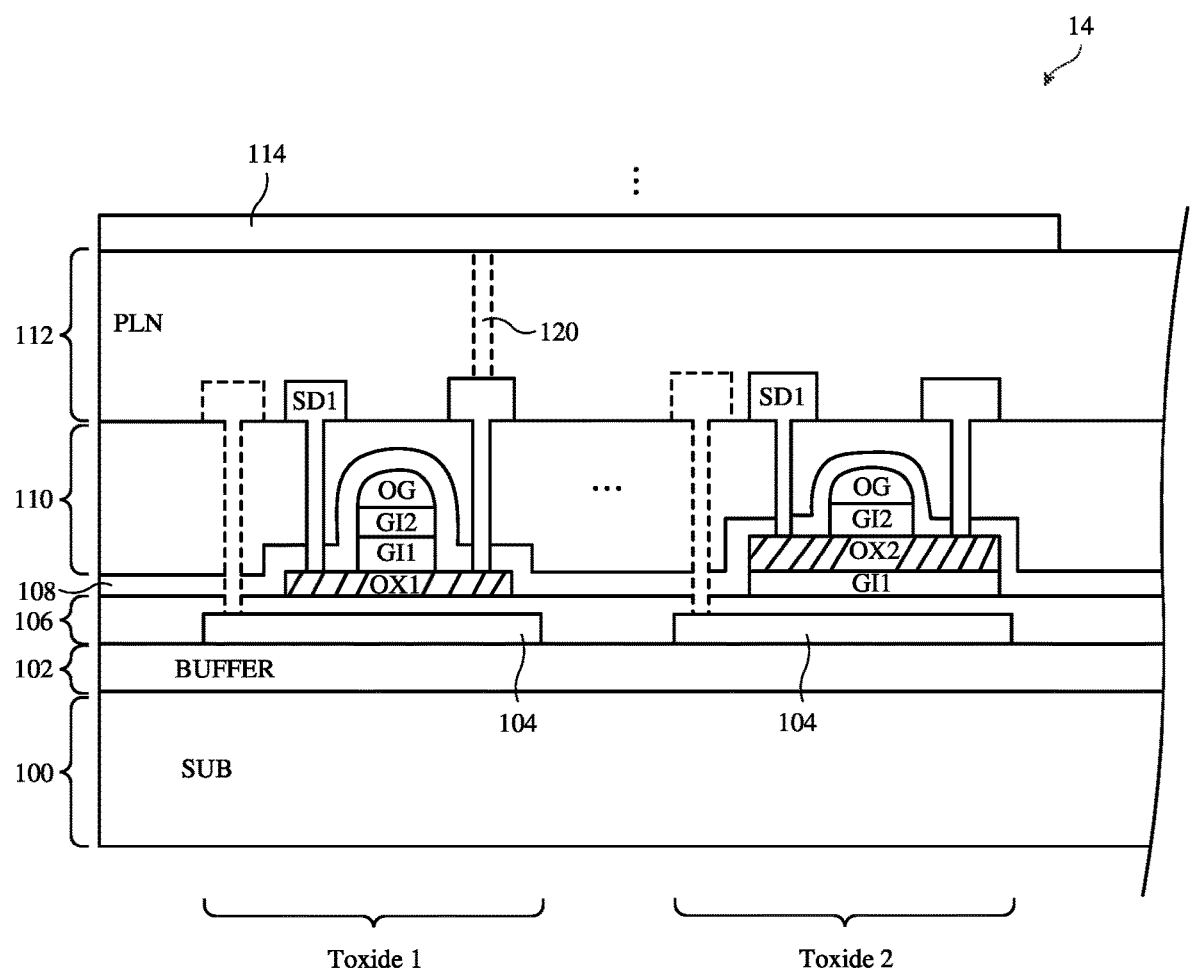
FIG. 5 is a cross-sectional side view of an illustrative display having at least two different semiconducting oxide layers in accordance with some embodiments.

FIG. 5 is a cross-sectional side view of display 14 having at least two different semiconducting oxide layers (e.g., semiconducting oxide layers formed at different processing steps using different materials or optionally using the same material). A "semiconducting oxide layer" is defined as an oxide layer that is formed from a semiconductor such as IGZO, IGTZO, ITO, ITZO, or other semiconductor material. As shown in FIG. 5, display 14 may have a display stackup that includes a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A conductive layer such as metal layer 104 may be formed on buffer layer 102. Conductive layer 104 may be a blanket layer when initially deposited on layer 102. Conductive layer 104 may be patterned to form respective metal shielding or bottom gate conductors for respective semiconducting oxide transistors such as Toxide1 and Toxide2. Metal layer 104 may be formed using molybdenum, aluminum, nickel, chromium, copper, titanium, silver, gold, a combination of these materials, other metals, or other suitable conductive material. Metal layer 104 may serve as a bottom shielding layer (e.g., a shielding layer configured to block potentially interfering electromagnetic fields and/or light). Metal layer 104 may also serve as a bottom gate conductor for one or more semiconducting oxide transistors (e.g., semiconducting oxide transistors Toxide1 and Toxide2). A buffer insulating layer such as buffer insulating layer 106 may be formed over metal layer 104 and on buffer layer 102. Buffer insulating layer 106 (sometimes referred to as a second buffer layer) may be formed from silicon oxide, silicon nitride, or other passivation or insulating material.

A first oxide layer OX1 may be formed on insulating layer 106. Oxide layer OX1 is formed from semiconductor material. A first gate insulating layer GI1 may be formed over first oxide layer OX1. A second oxide layer OX2 may be formed on first gate insulating layer GI1. Oxide layer OX2 is also formed from semiconductor material. Second oxide layer OX2 may be formed over first oxide layer OX1. Oxide layers OX1 and OX2 may be blanket layers when first deposited. Oxide layer OX1 may be patterned to formed respective portions of first semiconducting oxide transistors (e.g., a portion of oxide layer OX1 is patterned to form the active region of transistor Toxide1). Oxide layer OX2 may be patterned to formed respective portions of second semiconducting oxide transistors (e.g., a portion of oxide layer OX2 is patterned to form the active region of transistor Toxide2).

A second gate insulating layer GI2 (which is formed separately from GI1) may be formed over second oxide layer OX2. Gate insulating layers GI1 and GI2 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Gate insulating layers GI1 and GI2 may be blanket layers when first deposited. A first portion of layer GI1 may be patterned in between layer OX1 and the gate terminal of Toxide1, whereas a second portion of layer GI1 may be patterned under layer OX2 of Toxide2. A first portion of layer GI2 may be patterned in between layer OX1 and the gate terminal of Toxide1, whereas a second portion of layer GI2 may be patterned in between layer OX2 and the gate terminal of Toxide2. A top gate conductive layer such as gate layer OG may be formed on second gate insulating layer GI2. Top gate conductor(s) OG may be formed from molybdenum, titanium, aluminum, nickel, chromium, copper, silver, gold, a combination of these materials, other metals, or other suitable gate conductor material.

In the example of FIG. 5, semiconducting oxide transistor Toxide1 includes channel and source-drain active regions formed using first semiconducting oxide layer OX1, whereas semiconducting oxide transistor Toxide2 includes channel and source-drain active regions formed using second semiconducting oxide layer OX2. Semiconducting oxide transistor Toxide1 has gate insulating layers GI1 and GI2 separating oxide layer OX1 from its gate conductor OG.

Semiconducting oxide transistor Toxide2 has only gate insulating layer GI2 separating oxide layer OX2 from its gate conductor OG. Thus, the overall gate insulator of Toxide1 is thicker than the gate insulator of Toxide2. This difference in the overall thickness and composition of the gate insulating layer can be used to provide different device characteristics between transistor Toxide1 and Toxide2. Gate insulating layer GI1 may be formed using the same or different material as gate insulating layer GI2. In the scenario where conductors 104 also serve as bottom gate conductors, the bottom gate insulator thickness of transistor Toxide1 will be determined by the thickness of layer 106, whereas the bottom gate insulator thickness of transistor Toxide2 will be determined by the combined thickness of layers 106 and GI1. This difference in gate insulator thickness above and below the semiconducting oxide active region can be used to achieve different device characteristics.

In general, transistor Toxide1 may represent any semiconducting oxide transistor within display 14. As an example, transistor Toxide1 may represent transistors Tgd, Tdata, and Tini within pixel 22. As another example, transistor Toxide1 may represent transistors Tdrive, Tem1, and Tem2 within pixel 22. As another example, transistor Toxide1 may represent transistors within gate driver circuitry 34. Similarly, transistor Toxide2 may represent any semiconducting oxide transistor within display 14. As an example, transistor Toxide2 may represent transistors Tdrive, Tem1, and Tem2 within pixel 22. As another example, transistor Toxide2 may represent transistors Tgd, Tdata, and Tini within pixel 22. As another example, transistor Toxide2 may represent transistors within gate driver circuitry 34. As another example, transistor Toxide1 (which may represent switches for emission and clock signals, switches in the pixels or gate driver circuits etc.) may be designed to provide improved reliability by using IGZO, whereas transistor Toxide2 (which may represent switches for buffering and driving, switches in the pixels or gate driver circuits etc.) may be designed to provide improved mobility by using IGZTO. In other words, the use of at least two different semiconducting oxide transistors is not limited to only the active display area but can also be extended to the gate driver circuits and other peripheral display control circuits. Using different types of semiconducting oxide transistors across different areas of display 14 can enable high performance while also reducing panel border.

Semiconducting oxide layers OX1 and OX2 may be formed from the same or different semiconducting oxide material. If desired, oxide layer OX1 may be formed using a multilayer stackup of IGTZO, IGZO(111), and IGTZO to achieve good PBTS. The "111" notation refers to a 1:1:1 composition ratio between indium, gallium, and zinc, respectively. Different composition ratios can be adjusted to provide different device characteristics. As another example, to achieve good PBTS, oxide layer OX1 can be formed using IGZO(111) deposited using a relatively low oxide/argon deposition gas ratio (e.g., 20-40% oxide/argon deposition gas ratio). As another example, to achieve good PBTS, transistor Toxide1 can have its gate insulating layers GI1 and/or GI2 deposited using a relatively low nitrous oxide/silicon hafnium gas ratio (e.g., 20-40% $N_2O/SiH_4$ deposition gas ratio).

In other suitable embodiments, transistor Toxide1 can be formed to achieve good NBTS. To achieve good NBTS, oxide layer OX1 may be formed using a multilayer stackup of IGTZO, IGZO(136), and IGTZO to achieve good NBTS. The "136" notation refers to a 1:3:6 composition ratio between indium, gallium, and zinc, respectively. Different composition ratios can be adjusted to provide different device characteristics. As another example, to achieve good NBTS, oxide layer OX1 can be formed using IGZO(111) deposited using a relatively high oxide/argon deposition gas ratio (e.g., 80-90% oxide/argon deposition gas ratio). As another example, to achieve good NBTS, transistor Toxide1 can have its gate insulating layers GI1 and/or GI2 deposited using a relatively high nitrous oxide/silicon hafnium gas ratio (e.g., 80-90% $N_2O/SiH_4$ deposition gas ratio).

In other suitable embodiments, transistor Toxide1 can be formed to achieve high mobility. To achieve high mobility, oxide layer OX1 may be formed using high mobility material such as IGTZO, ITO, ITZO, a combination of these materials, and/or other high mobility compound(s). As another example, to achieve high mobility, oxide layer OX1 can be formed using IGZO(111) deposited using a relatively low oxide/argon deposition gas ratio (e.g., 20-40% oxide/argon deposition gas ratio).

If desired, transistor Toxide2 (including oxide layer OX2) can be formed using a different material and/or using different deposition techniques than transistor Toxide1 to provide different device characteristics. As an example, oxide layer OX2 may be formed using a multilayer stackup of IGTZO, IGZO(111), and IGTZO to achieve good PBTS. As another example, to achieve good PBTS, oxide layer OX2 can be formed using IGZO(111) deposited using a relatively low oxide/argon deposition gas ratio (e.g., 20-40% oxide/argon deposition gas ratio). As another example, to achieve good PBTS, transistor Toxide2 can have its gate insulating layer GI2 deposited using a relatively low nitrous oxide/silicon hafnium gas ratio (e.g., 20-40% $N_2O/SiH_4$ deposition gas ratio).

In other suitable embodiments, transistor Toxide2 can be formed to achieve good NBTS. To achieve good NBTS, oxide layer OX2 may be formed using a multilayer stackup of IGTZO, IGZO(136), and IGTZO to achieve good NBTS. As another example, to achieve good NBTS, oxide layer OX2 can be formed using IGZO(111) deposited using a relatively high oxide/argon deposition gas ratio (e.g., 80-90% oxide/argon deposition gas ratio). As another example, to achieve good NBTS, transistor Toxide2 can have its gate insulating layer GI2 deposited using a relatively high nitrous oxide/silicon hafnium gas ratio (e.g., 80-90% $N_2O/SiH_4$ deposition gas ratio).

In other suitable embodiments, transistor Toxide2 can be formed to achieve high mobility. To achieve high mobility, oxide layer OX2 may be formed using high mobility material such as IGTZO, ITO, ITZO, a combination of these materials, and/or other high mobility compound(s). As another example, to achieve high mobility, oxide layer OX2 can be formed using IGZO(111) deposited using a relatively low oxide/argon deposition gas ratio (e.g., 20-40% oxide/argon deposition gas ratio).

Still referring to FIG. 5, a first interlayer dielectric (ILD1) layer 108 may be formed over the OG conductor. A second interlayer dielectric (ILD2) layer 110 may be formed on ILD1 layer 108. The ILD layers 108 and 110 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Layers 108 and 110 may be formed from the same or different material.

A first source-drain metal routing layer SD1 may be formed on layer 110. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths.

As shown in FIG. 5, some of the SD1 metal routing paths may be coupled using vertical via(s) to one or more source-drain regions associated with transistor Toxide1 and to one or more source-drain regions associated with transistor Toxide2. Some of the SD1 metal routing paths may optionally be coupled to the bottom conductive layer 104 (see dotted structures in FIG. 5).

A planarization (PLN) layer such as layer 112 may be formed over the SD1 metal routing layer. Planarization layer 112 may be formed from organic dielectric materials such as polymer. An anode layer including an anode conductor 114 forming the anode terminal of the organic light-emitting diode 26 may be formed on planarization layer 112. Anode conductor 114 may be coupled to at least some of the SD1 metal routing paths using vertical via(s) 120 formed through planarization layer 112. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

Figure 6:
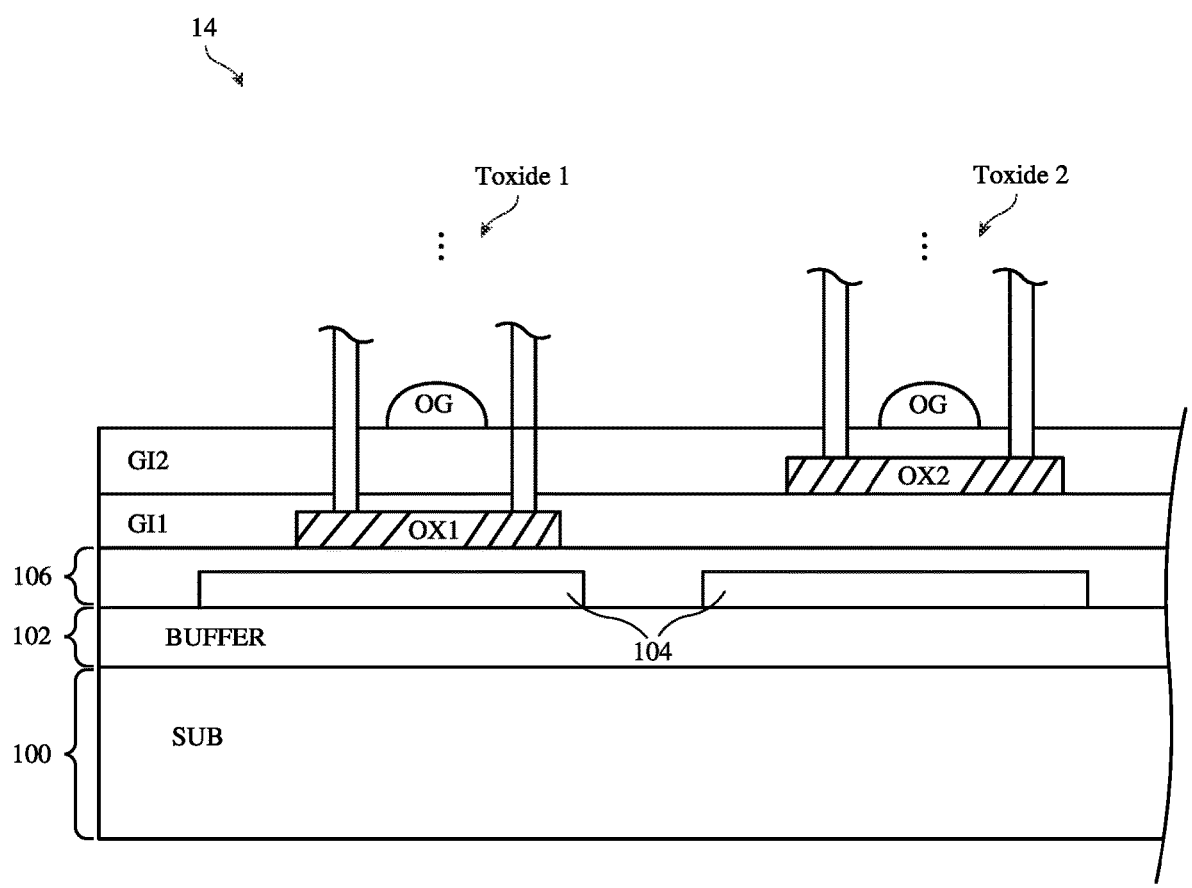
FIG. 6 is a cross-sectional side view of an illustrative display having different semiconducting oxide layers and blanket gate insulating layers in accordance with some embodiments.

The example of FIG. 5 in which gate insulating layers GI1 and GI2 are patterned and self-aligned with the overlying gate conductors OG is merely illustrative. FIG. 6 illustrates another suitable embodiment in which gate insulating layers GI1 and GI2 are not patterned and remain as blanket layers in the final product. As shown in FIG. 6, first gate insulating layer GI1 is a blanket layer that extends across the width of display 14 and covers first semiconducting oxide layer OX1 and layer 106. Second gate insulating layer GI2 is also a blanket layer that extends across the width of display 14 and covers first gate insulating layer GI1 and second semiconducting oxide layer OX2.

Figure 7A:
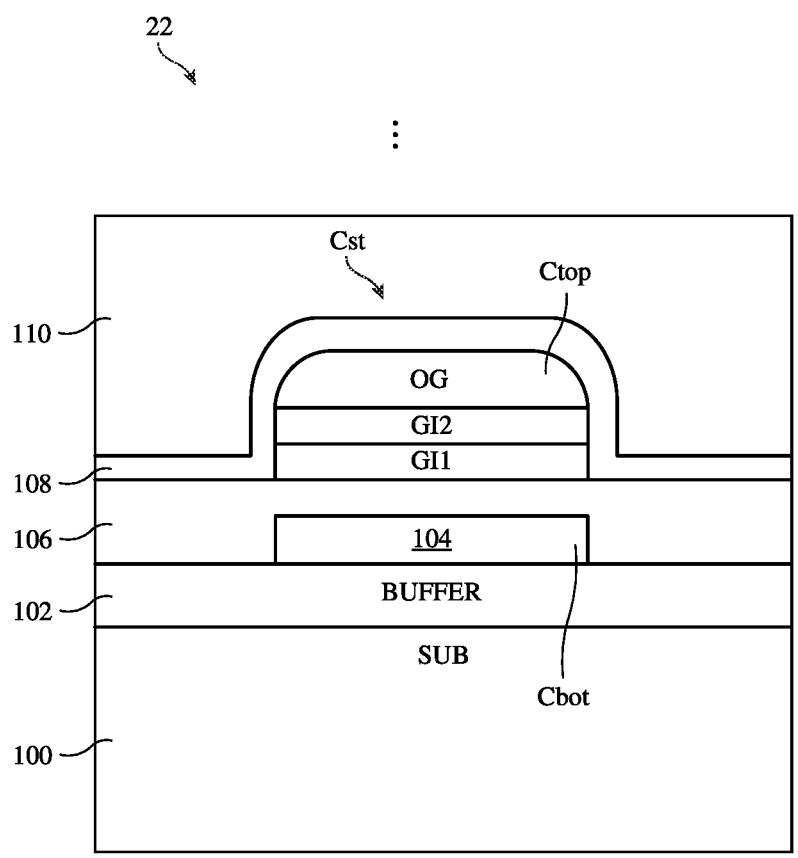
FIGS. 7A-7E are cross-sectional side views showing different conductive layers that can be used to form a capacitor within a display pixel in accordance with some embodiments.
Figure 7B:
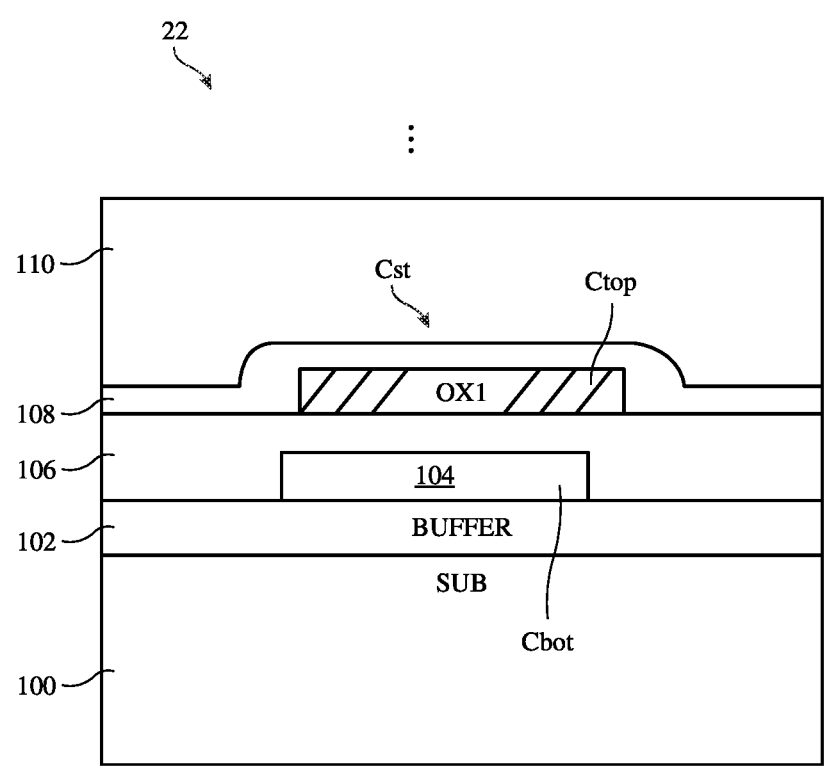

Display pixel 22 (see, e.g., FIG. 3) may include at least one capacitor such as storage capacitor Cst. FIGS. 7A-7E are cross-sectional side views showing different conductive layers that can be used to form a capacitor within pixel 22 such as capacitor Cst. FIG. 7A shows a first example in which capacitor Cst has a bottom plate (see Cbot) formed using conductive layer 104 and has a top plate (see Ctop) formed using gate layer OG. The example of FIG. 7A in which capacitor Cst is formed from layers 104 and OG is merely illustrative. FIG. 7B illustrates another example in which capacitor Cst has a bottom plate (see Cbot) formed using conductive layer 104 and has a top plate (see Ctop) formed using first oxide layer OX1. As another example, capacitor Cst may have a bottom plate formed using conductive layer 104 and a top plate formed using second oxide layer OX2.

Figure 7C:
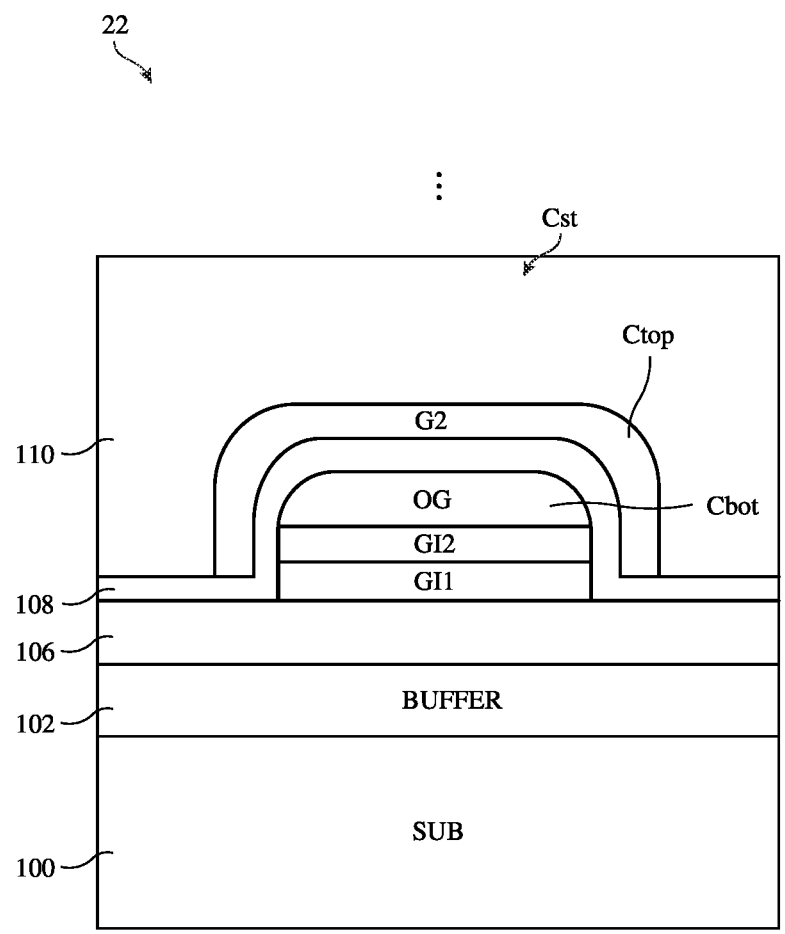

FIG. 7C illustrates another example in which capacitor Cst has a bottom plate (see Cbot) formed using gate layer OG and has a top plate (see Ctop) formed using a second gate layer G2. Gate layer G2 may be formed over first gate layer OG and first ILD layer 108 but under second ILD layer 110. Layer 108 may be interposed between layers OG and G2. Gate layer G2 may be formed using molybdenum, aluminum, nickel, chromium, copper, titanium, silver, gold, a combination of these materials, other metals, or other suitable conductive material.

Figure 7D:
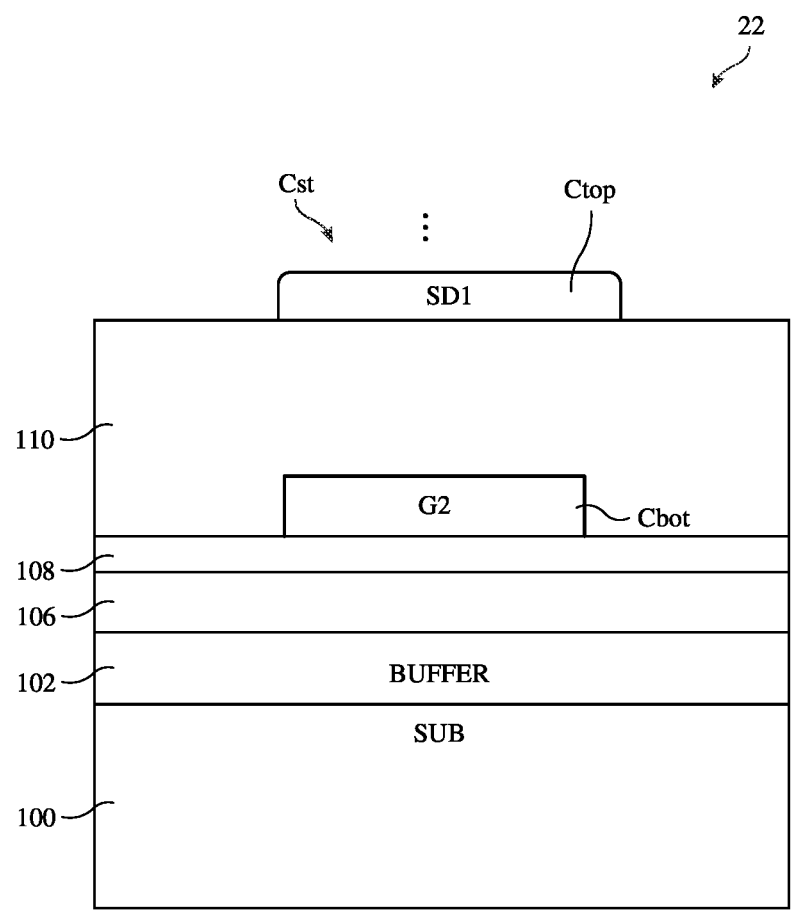
Figure 7E:
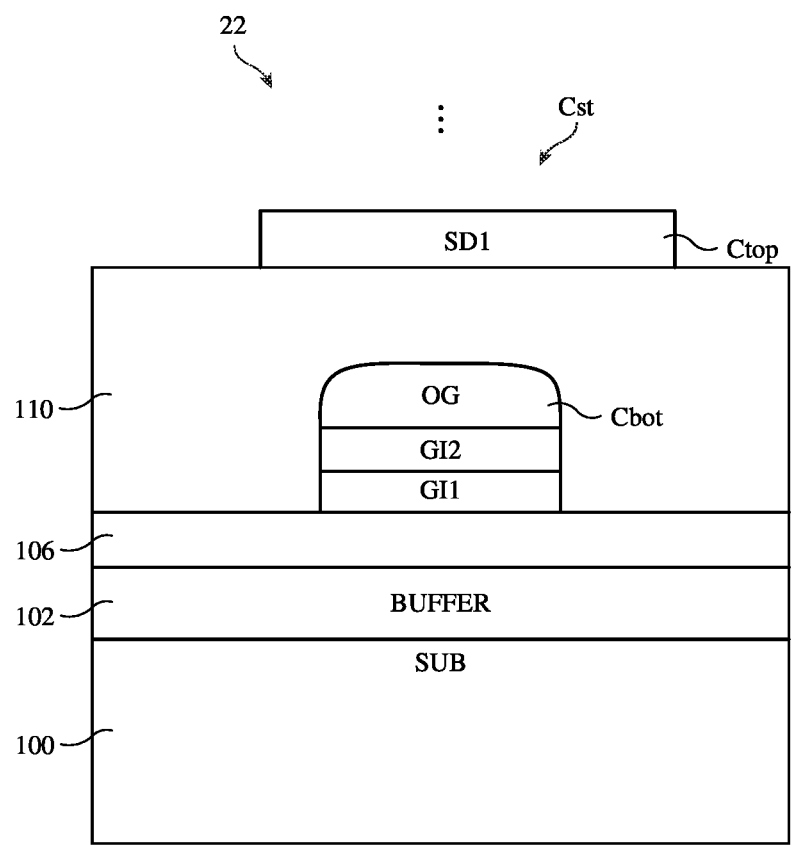

FIG. 7D illustrates another example in which capacitor Cst has a bottom plate (see Cbot) formed using the second gate layer G2 (i.e., a metal conductor separate from the OG layer) and has a top plate (see Ctop) formed using the SD1 metal routing layer. FIG. 7E illustrates yet another example in which capacitor Cst has a bottom plate (see Cbot) formed using the first gate layer OG and has a top plate (see Ctop) formed using the SD1 metal routing layer. The examples of FIG. 7A-7E are merely illustrative. In general, the top and bottom plates of capacitor Cst may be formed using any two different conductive layers within the overall display stackup. The specific layers used to form capacitor Cst may be selected to provide the desired device characteristic so as to optimize the performance and operation of pixel 22.

Figure 8:
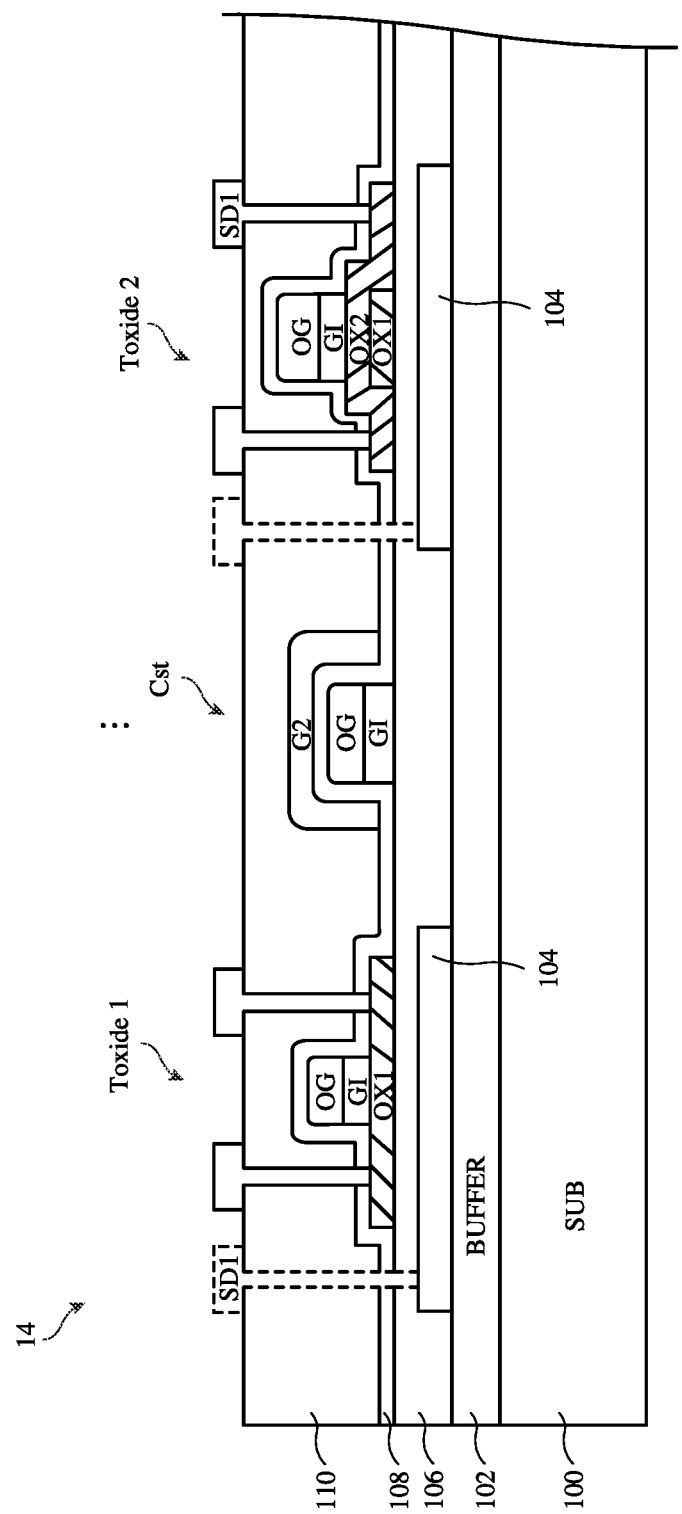
FIGS. 8 and 9 are cross-sectional side views of an illustrative display having two different semiconducting oxide layers in direct contact in accordance with some embodiments.

The example of FIG. 5 in which semiconducting oxide transistor Toxide2 includes only oxide layer OX2 is merely illustrative. FIG. 8 shows another suitable embodiment in which semiconducting oxide transistor Toxide2 includes a combination of at least two different semiconducting oxide layers OX1 and OX2. As shown in FIG. 8, transistor Toxide1 is formed using oxide layer OX1, gate insulating layer GI, and gate conductor OG, whereas transistor Toxide2 is formed using oxide layers OX1 and OX2, gate insulating layer GI, and gate conductor OG. Oxide layer OX2 may be formed directly on top of and in direct contact with oxide layer OX1. Oxide layers OX1 and OX2 may be formed using the same or different materials as described above in connection with FIG. 5. Configured in this way, transistor Toxide2 has source-drain terminals coupled to a channel region formed from two different oxide layers and may therefore exhibit different device characteristics than transistor Toxide1 (which includes only oxide layer OX1).

The example of FIG. 8 includes only one gate insulating layer GI. If desired, two or more gate insulating layers may be formed (see, e.g., FIG. 5). FIG. 8 also shows a storage capacitor Cst formed using the second gate layer G2 and the first gate layer OG (similar to the capacitor configuration of FIG. 7C), which is merely illustrative. If desired, the storage capacitor Cst of FIG. 8 may instead be formed using other capacitor configurations as shown in FIGS. 7A, 7B, 7D, and 7E.

Figure 9:
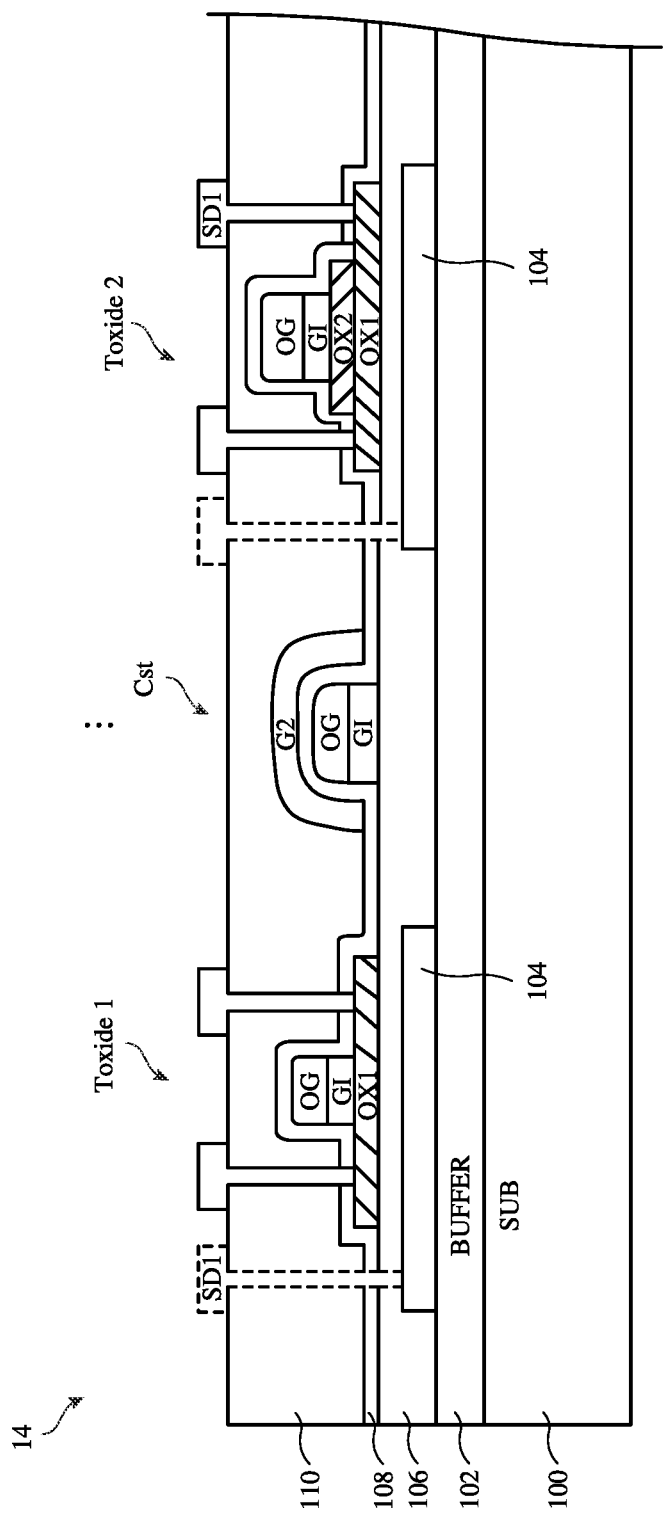

The example of FIG. 8 in which the source-drain terminals of semiconducting oxide transistor Toxide2 are directly coupled to the second oxide layer OX2 (e.g., the source-drain contacts are etched all the way down to make physical contact with oxide layer OX2) is merely illustrative. In FIG. 8, oxide layer OX2 is wider than oxide layer OX1 and completely covers layer OX1. FIG. 9 shows another suitable embodiment in which the source-drain terminals of semiconducting oxide transistor Toxide2 are directly coupled to the first oxide layer OX1 (e.g., the source-drain contacts are etched all the way down to make physical contact with oxide layer OX1). As shown in FIG. 9, first oxide layer OX1 is wider than second oxide layer OX2. Second oxide layer OX2 only partially overlaps and only partially covers oxide layer OX1.

The example of FIG. 9 includes only one gate insulating layer GI. If desired, two or more gate insulating layers may be formed (see, e.g., FIG. 5). FIG. 9 also shows a storage capacitor Cst formed using the second gate layer G2 and the first gate layer OG (similar to the capacitor configuration of FIG. 7C), which is merely illustrative. If desired, the storage capacitor Cst of FIG. 9 may instead be formed using other capacitor configurations as shown in FIGS. 7A, 7B, 7D, and 7E.

Figure 10:
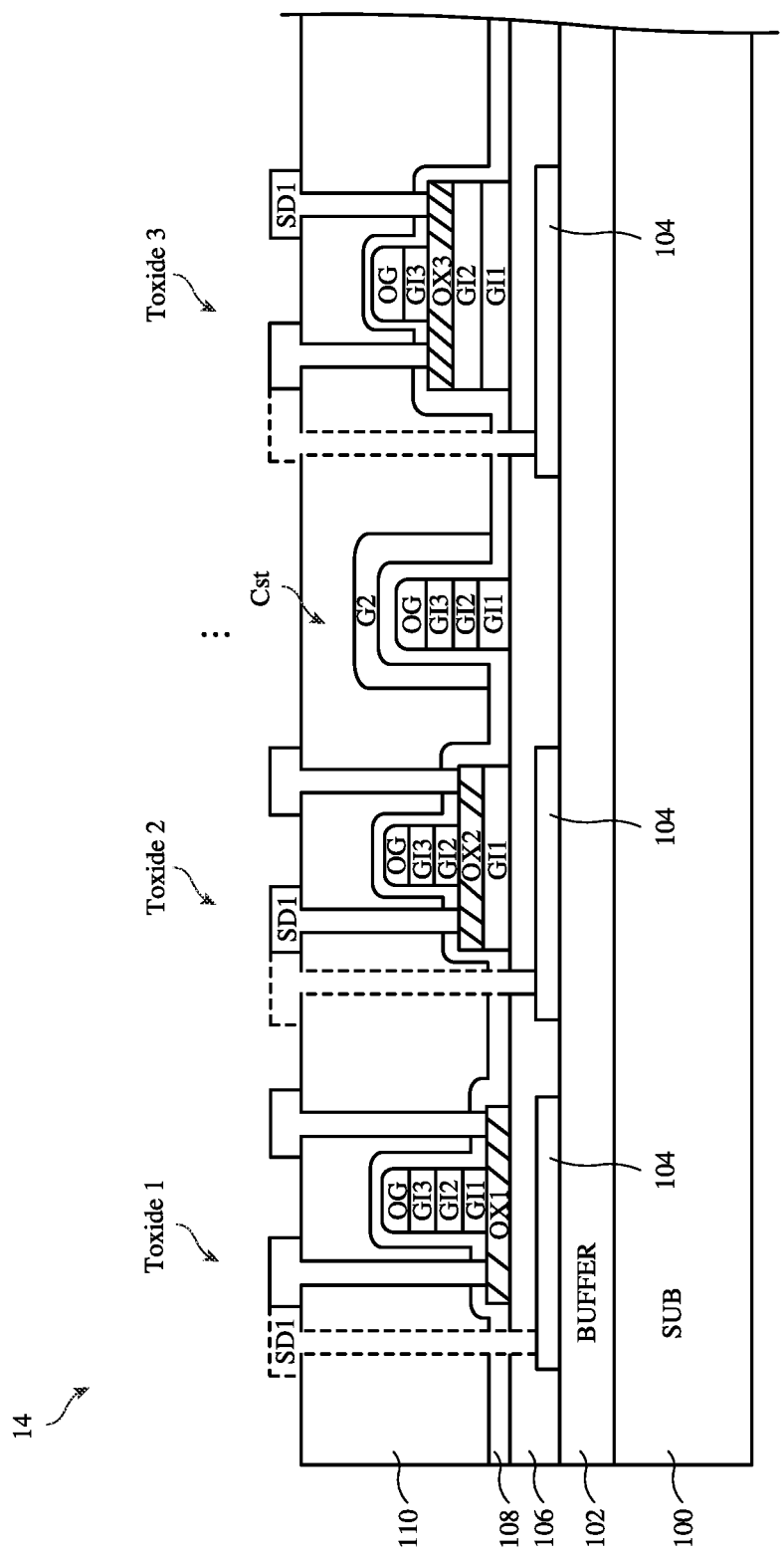
FIG. 10 is a cross-sectional side view of an illustrative display having at least three different semiconducting oxide layers in accordance with some embodiments.

The embodiments of FIGS. 5-9 that include two different semiconducting oxide layers OX1 and OX2 are merely illustrative and are not intended to limit the scope of the present embodiments. FIG. 10 illustrates yet another suitable embodiment in which display 14 can be provided with at least three different semiconducting oxide layers OX1, OX2, and OX3. As shown in FIG. 10, display 14 may include a first semiconducting oxide transistor Toxide1 that includes first oxide layer OX1 and a first gate conductor OG separated from oxide layer OX1 with gate insulating layers GI1, GI2, and GI3. Display 14 may further include a second semiconducting oxide transistor Toxide2 that includes second oxide layer OX2 and a second gate conductor OG separated from oxide layer OX2 with only gate insulating layers GI2 and GI3. Second oxide layer OX2 may be formed on top of first gate insulating layer GI1. Display 14 may further include a third semiconducting oxide transistor Toxide3 that includes third oxide layer OX3 and a third gate conductor OG separated from oxide layer OX3 with only gate insulating layer GI3. Third oxide layer OX3 may be formed on top of second gate insulating layer GI2. In other words, second semiconducting oxide layer OX2 is formed over (above) first semiconducting oxide layer OX1, and third semiconducting oxide layer OX3 is formed over (above) second semiconducting oxide layer OX2.

Semiconducting oxide layers OX1, OX2, and OX3 may be formed from the same or different semiconducting oxide material. Transistors Toxide1, Toxide2, and Toxide3 may each represent different transistors within display 14 and may exhibit different device characteristics. Transistors Toxide1, Toxide2, and Toxide3 may be separately optimized for good NBTS, good PBTS, and/or high mobility. In general, display 14 may include semiconducting transistors formed using more than three semiconducting oxide layers formed at different times (e.g., using four different semiconducting oxide layers of potentially different material, using five different semiconducting oxide layers of potentially differing material, using six different semiconducting oxide layers of potentially varying composition, etc.).

FIG. 10 also shows storage capacitor Cst formed using the second gate layer G2 and the first gate layer OG (similar to the capacitor configuration of FIG. 7C), which is merely illustrative. If desired, the storage capacitor Cst of FIG. 10 may instead be formed using other capacitor configurations as shown in FIGS. 7A, 7B, 7D, and 7E.

Figure 11:
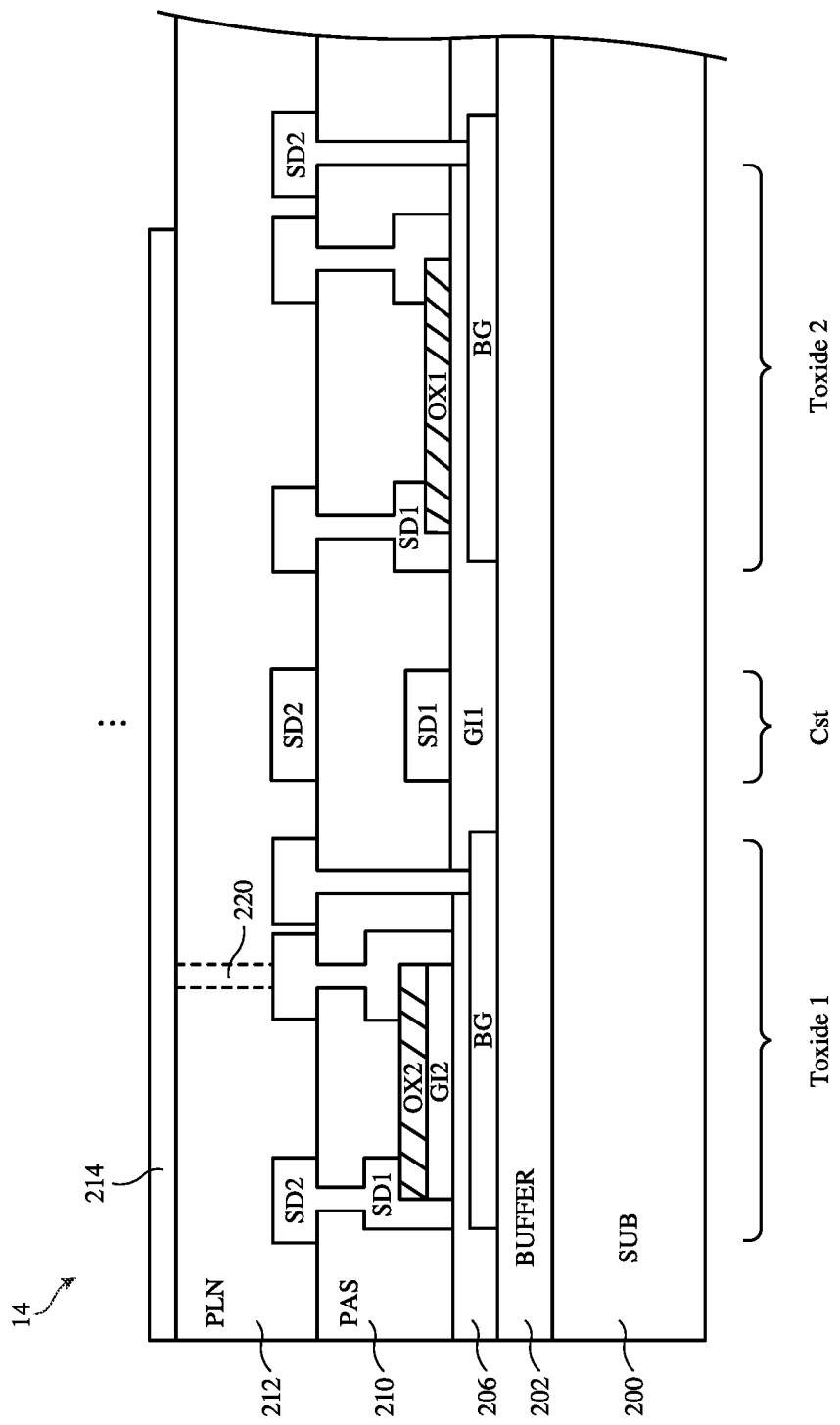
FIG. 11 is a cross-sectional side view of an illustrative display having bottom gate conductors in accordance with some embodiments.

The embodiments of FIGS. 5-10 that include semiconducting oxide transistors with top gate conductor OG are merely illustrative and are not intended to limit the scope of the present embodiments. FIG. 11 illustrates yet another suitable embodiment in which display 14 includes bottom gate conductors BG (sometimes referred to ask back-channel etched gate conductors). As shown in FIG. 11, display 14 may have a display stackup that includes a substrate layer such as substrate 200. Substrate 200 may optionally be covered with one or more buffer layers 202. Buffer layer(s) 202 may include inorganic buffer layers such as layers of silicon oxide, silicon nitride, or other passivation or dielectric material.

A conductive gate layer such as bottom gate layer BG may be formed on buffer layer 202. Bottom gate layer BG may be formed using molybdenum, aluminum, nickel, chromium, copper, titanium, silver, gold, a combination of these materials, other metals, or other suitable conductive material. A first gate insulating layer GI1 may be formed over layer BG and buffer layer 202. A first oxide layer OX1 may be formed on first gate insulating layer GI1. A second gate insulating layer GI2 may be formed on first gate insulating layer GI1. Second gate insulating layer GI2 may be formed before the formation of oxide layer OX1 or after the formation of oxide layer OX1.

A second oxide layer OX2 may be formed on second gate insulating layer GI2. Gate insulating layers GI1 and GI2 may be formed from the same of different materials and may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

In the example of FIG. 5, semiconducting oxide transistor Toxide1 includes channel and source-drain active regions formed using first semiconducting oxide layer OX1 and includes a gate conductor formed using underlying layer BG, whereas semiconducting oxide transistor Toxide2 includes channel and source-drain active regions formed using second semiconducting oxide layer OX2 and includes a gate conductor formed using underlying layer BG. Semiconducting oxide transistor Toxide1 has gate insulating layers GI1 and GI2 separating oxide layer OX1 from its gate conductor BG. Semiconducting oxide transistor Toxide2 has only gate insulating layer GI1 separating oxide layer OX2 from its gate conductor BG. Thus, the overall gate insulator of Toxide1 is thicker than the gate insulator of Toxide2 in FIG. 11. This difference in the overall thickness and composition of the gate insulating layer can be used to provide different device characteristics between transistor Toxide1 and Toxide2.

Transistors Toxide1 and Toxide2 in FIG. 11 may each represent different transistors within display 14 and may exhibit different device characteristics. Transistors Toxide1 and Toxide2 may be separately optimized for good NBTS, good PBTS, and/or high mobility (e.g., using the materials and deposition techniques described in connection with FIG. 5).

Still referring to FIG. 11, a first source-drain metal routing layer SD1 may be formed after second oxide layer OX2. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths. In the example of FIG. 11, some of the SD1 metal routing paths may be coupled to oxide layer OX2 to form the source-drain terminals of transistor Toxide1, and some of the SD1 metal routing paths may be coupled to oxide layer OX1 to form the source-drain terminals of transistor Toxide2.

One or more passivation (PAS) layers 210 may be formed over the SD1 metal routing layer. Passivation layer 210 may be formed from silicon oxide, silicon nitride, or other passivation or dielectric material. A second source-drain metal routing layer SD2 may be formed on passivation layer 210. The SD2 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD2 metal routing layer may be patterned and/or etch to form SD2 metal routing paths. In the example of FIG. 11, some of the SD2 metal routing paths may be coupled to an underlying SD1 metal layer or an underling bottom gate conductor BG.

A planarization (PLN) layer such as layer 212 may be formed over the SD2 metal routing layer. Planarization layer 212 may be formed from organic dielectric materials such as polymer. An anode layer including an anode conductor 214 forming the anode terminal of the organic light-emitting diode 26 may be formed on planarization layer 212. Anode conductor 214 may be coupled to at least some of the SD2 metal routing paths using vertical via(s) 220 formed through planarization layer 212. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

FIG. 11 also shows storage capacitor Cst having a top plate formed from the SD2 metal routing layer and having a bottom plate formed from the SD1 metal routing layer, which is merely illustrative. If desired, the storage capacitor Cst of FIG. 11 may instead be formed using other capacitor configurations as shown in FIGS. 7A-7E.

The foregoing is merely illustrative and various modifications can be made to the described embodiments. The foregoing embodiments may be implemented individually or in any combination.

What is claimed is:

1. A display having an array of pixels, comprising:
   a substrate layer;
   a first semiconducting oxide layer formed over the substrate layer;
   a second semiconducting oxide layer formed over the substrate layer;
   a first gate insulating layer that extends across a width of the display and covers the first semiconducting oxide layer;
   a second gate insulating layer that extends across the width of the display and covers the second semiconducting oxide layer; and
   a gate conductor layer, wherein at least one of the pixels in the array comprises:
      a first semiconducting oxide transistor having an active region formed from a portion of the first semiconducting oxide layer and having a first gate terminal formed from a first portion of the gate conductor layer; and
      a second semiconducting oxide transistor having an active region formed from a portion of the second semiconducting oxide layer and having a second gate terminal formed from a second portion of the gate conductor layer.

2. The display of claim 1, wherein:
   the first semiconducting oxide layer comprises a semiconductor material; and
   the second semiconducting oxide layer comprises the semiconductor material.

3. The display of claim 1,
   wherein the second gate insulating layer is formed over the first gate insulating layer, and wherein:
   a first portion of the first gate insulating layer is interposed between the active region and the first gate terminal of the first semiconducting oxide transistor;
   a first portion of the second gate insulating layer is interposed between the active region and the first gate terminal of the first semiconducting oxide transistor;
   a second portion of the first gate insulating layer is formed under the active region of the second semiconducting oxide transistor; and
   a second portion of the second gate insulating layer is interposed between the active region and the second gate terminal of the second semiconducting oxide transistor.

4. The display of claim 1, further comprising:
   a capacitor having a first terminal formed from a metal conductor above the gate conductor layer and having a second terminal formed from a third portion of the gate conductor layer.

5. The display of claim 1, further comprising:
   a capacitor having a first terminal formed from a source-drain metal conductor and having a second terminal formed from a metal conductor separate from the gate conductor layer.

6. The display of claim 1, further comprising:
   a capacitor having a first terminal formed from a source-drain metal conductor and having a second terminal formed from a third portion of the gate conductor layer.

7. The display of claim 1, wherein the active region of the second semiconducting oxide transistor includes an additional portion of the first semiconducting oxide layer.

8. The display of claim 1, further comprising:
   a third semiconducting oxide layer formed over the substrate layer; and
   a third semiconducting oxide transistor having an active region formed from a portion of the third semiconducting oxide layer and having a third gate terminal formed from a third portion of the gate conductor layer.

9. The display of claim 1, wherein the gate conductor layer is below the first and second semiconducting oxide layers.

10. The display of claim 1, wherein:
    the first semiconducting oxide transistor is optimized for negative-bias-temperature-stress (NBTS) stability; and
    the second semiconducting oxide transistor is optimized for positive-bias-temperature-stress (PBTS) stability.

11. The display of claim 1, further comprising:
    a first dielectric layer formed over the gate conductor layer; and
    a second dielectric layer formed over the first dielectric layer.

12. The display of claim 1, wherein:
    the first semiconducting oxide layer comprises a first semiconductor material; and
    the second semiconducting oxide layer comprises a second semiconductor material different than the first semiconductor material.

13. The display of claim 12, wherein the first semiconductor material is selected from the group consisting of: IGTZO, ITO, ITZO, IGZO(111), and IGZO(136), and wherein the second semiconductor material is selected from the group consisting of: IGTZO, ITO, ITZO, IGZO(111), and IGZO(136).

14. The display of claim 1, further comprising:
    a conductive layer between the substrate layer and the first semiconducting oxide layer, wherein:
       a first portion of the conductive layer is formed below the active region of the first semiconducting oxide transistor; and
       a second portion of the conductive layer is formed below the active region of the second semiconducting oxide transistor.

15. The display of claim 14, further comprising:
    a capacitor having a first terminal formed from a third portion of the gate conductor layer and having a second terminal formed from a third portion of the conductive layer.

16. The display of claim 14, further comprising:
a capacitor having a first terminal formed from an additional portion of the first semiconducting oxide layer and having a second terminal formed from a third portion of the conductive layer.

17. A method of forming a display, comprising:
obtaining a substrate layer;
forming a first semiconducting oxide layer over the substrate layer;
after forming the first semiconducting oxide layer, forming a second semiconducting oxide layer over the substrate layer;
forming a gate insulating layer above the first semiconducting oxide layer and below the second semiconducting oxide layer; and
forming a gate conductor layer over the second semiconducting oxide layer, wherein the display comprises:
a first semiconducting oxide transistor having an active region formed from a portion of the first semiconducting oxide layer and having a first gate terminal formed from a first portion of the gate conductor layer; and
a second semiconducting oxide transistor having an active region formed from a portion of the second semiconducting oxide layer and having a second gate terminal formed from a second portion of the gate conductor layer.

18. The method of claim 17, wherein:
forming the first semiconducting oxide layer comprises forming a first semiconductor material; and
forming the second semiconducting oxide layer comprises forming a second semiconductor material different than or identical to the first semiconductor material.

19. The method of claim 17, wherein:
forming the first semiconducting oxide layer comprises depositing semiconductor material under a first deposition condition; and
forming the second semiconducting oxide layer comprises depositing semiconductor material under a second deposition condition different than the first deposition condition.

20. The method of claim 17, wherein forming the second semiconducting oxide layer comprises forming the second semiconducting oxide layer directly on the first semiconducting oxide layer.

21. The method of claim 17, further comprising:
after forming the second semiconducting oxide layer, forming a third semiconducting oxide layer over the substrate layer.

22. The method of claim 17, further comprising:
forming a first conductor under the active region of the first semiconducting oxide transistor; and
forming a second conductor under the active region of the second semiconducting oxide transistor.

23. An apparatus, comprising:
a first semiconducting oxide transistor formed on a substrate, the first semiconducting oxide transistor having a first active region formed from a first oxide semiconductor to provide a first device characteristic; and
a second semiconducting oxide transistor formed on the substrate, the second semiconducting oxide transistor having a second active region formed from a second oxide semiconductor different than the first oxide semiconductor to provide a second device characteristic different than the first device characteristic; and
a third semiconducting oxide transistor formed on the substrate, the third semiconducting oxide transistor having a third active region formed from a third oxide semiconductor different than the first and second oxide semiconductors to provide a third device characteristic different than the first and second device characteristics.

24. The apparatus of claim 23, further comprising:
a gate insulating layer formed above the first active region and formed below the second active region.

25. The apparatus of claim 23, wherein the second active region also includes the first oxide semiconductor.

26. The apparatus of claim 23, wherein:
the first semiconducting oxide transistor comprises a first gate conductor and a first number of gate insulating layers between the first gate conductor and the first active region; and
the second semiconducting oxide transistor comprises a second gate conductor and a second number of gate insulating layers, different than the first number of gate insulating layers, between the second gate conductor and the second active region.

27. The apparatus of claim 23, wherein:
the first semiconducting oxide transistor comprises a first switch within a display pixel; and
the second semiconducting oxide transistor comprises a second switch within the display pixel.

28. The apparatus of claim 22, wherein:
the first semiconducting oxide transistor comprises a switch within a display pixel; and
the second semiconducting oxide transistor comprises a switch within gate driver circuitry configured to provide at least one control signal to the display pixel.

* * * * *